(12) United States Patent
Lee et al.

(10) Patent No.: US 6,586,687 B2
(45) Date of Patent: Jul. 1, 2003

(54) PRINTED WIRING BOARD WITH HIGH DENSITY INNER LAYER STRUCTURE

(75) Inventors: Bruce W. Lee, Chippewa Falls, MN (US); David G. Swoboda, Chippewa Falls, MN (US)

(73) Assignee: TTM Technologies, Inc., Chippewa Falls, WI (US)

( * ) Notice: Subject to any disclaimer, the term of this patent is extended or adjusted under 35 U.S.C. 154(b) by 0 days.

(21) Appl. No.: 09/951,303

(22) Filed: Sep. 10, 2001

(65) Prior Publication Data

US 2003/0047355 A1 Mar. 13, 2003

(51) Int. Cl.[7] .......................... H01R 12/04; H05K 1/11
(52) U.S. Cl. .......................... 174/262; 174/261
(58) Field of Search .......................... 174/262–266, 174/261

(56) References Cited

U.S. PATENT DOCUMENTS

| | | | |
|---|---|---|---|
| 4,606,787 A | 8/1986 | Pelligrino | 156/632 |
| 4,854,038 A * | 8/1989 | Wiley | 29/830 |
| 4,931,134 A * | 6/1990 | Hatkevitz et al. | 216/17 |
| 5,114,518 A | 5/1992 | Hoffarth et al. | 156/212 |
| 6,081,026 A * | 6/2000 | Wang et al. | 257/691 |
| 6,239,485 B1 * | 5/2001 | Peters et al. | 257/691 |
| 6,281,452 B1 * | 8/2001 | Prasad et al. | 174/262 |

\* cited by examiner

*Primary Examiner*—David L. Talbott
*Assistant Examiner*—Jeremy Norris
(74) *Attorney, Agent, or Firm*—Rutan & Tucker, LLP; Robert D. Fish; David J. Zoetewey

(57) ABSTRACT

A printed wiring board (PWB) comprises an inner high density circuit routing component laminated within the wiring board, and plated through holes electrically coupling the inner high density circuit to a conductive pattern located on a surface of the PWB. A preferred method for forming such a PWB comprises: providing a built up high density routing component; providing two wiring boards; laminating the built up routing component between the two wiring boards; and using plated through holes to electrically connect a conductive portion of each of the wiring boards to the built up routing component.

9 Claims, 1 Drawing Sheet

# PRINTED WIRING BOARD WITH HIGH DENSITY INNER LAYER STRUCTURE

FIELD OF THE INVENTION

The field of the invention is printed wiring board fabrication.

BACKGROUND OF THE INVENTION

Printed wiring boards are known electronic component structures which contain copper strips or paths arranged in a conductive pattern on a relatively flat electrically insulative structure or base. The copper strips form current-conducting paths, the electric wiring, by means of which other electrical components thereafter mounted on the board may receive or pass electrical current to other electrical components, similarly mounted, or from a power source. These circuit/wiring boards are notoriously old and well-known, having achieved wide application in all kinds of electronic devices, including radios, televisions, and computers, to name a few.

One wiring board structure is referred to as a two-sided plated through-hole board. The board contains electrical conductors on its front and back surfaces, and at least some of those conductors on opposite sides are electrically interconnected by means of the plated "through-hole" connections. The through-hole is a hole formed through the board between intercepting conductors on the opposite board sides and the hole wall is plated with metal electrically connecting the two conductors. A number of these wiring boards may be laminated or bonded together to form what is known as a multi-layer printed wiring board, and in such multi-layer wiring board through-holes drilled through the layers after the layers are aligned may form electrical connections to different conductive layers in the bonded stack. A less complex printed wiring board is a single-sided plated through-hole wiring board in which a through-hole is drilled through the board and plated with metal even though a conductor circuit pattern appears on only one board surface.

Unfortunately, increasing the number of layers in a multi-layer board tends to cause difficulties in processing and to reduce yields. In particular, drilling and electro-plating through holes becomes more difficult as layer counts increase. Thus, there is a continuing need for newer assemblies and methods for producing assemblies having lower layer counts.

SUMMARY OF THE INVENTION

The present invention is directed to methods and devices relating to the fabrication of wiring boards having a built up layer laminated within the board. More specifically, a preferred printed wiring board (PWB) comprises an inner high density circuit routing component laminated within the wiring board, and plated through holes electrically coupling the inner high density circuit to a conductive pattern located on a surfaces of the PWB. A preferred method for forming such a PWB comprises: providing a high density routing component having an exposed conductive pattern on at least one surface; providing wiring board layers; laminating the high density routing component between the two wiring board layers; electrically connecting a conductive portion of each of the wiring board layers to the high density routing component.

Various objects, features, aspects and advantages of the present invention will become more apparent from the following detailed description of preferred embodiments of the invention, along with the accompanying drawings in which like numerals represent like components.

DETAILED DESCRIPTION

Figure 1:
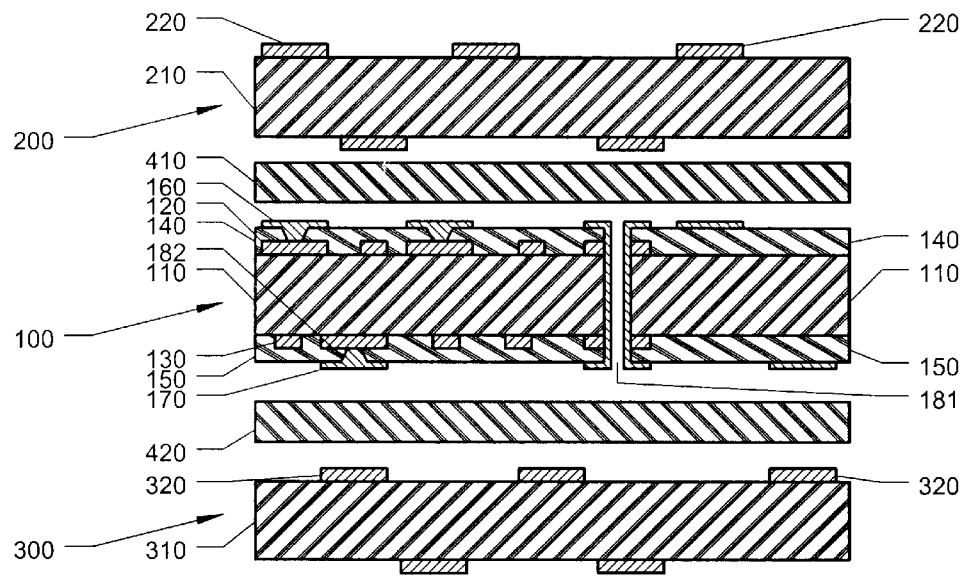
FIG. 1 is an exploded cutaway view of a wiring board assembly embodying the invention.
Figure 2:
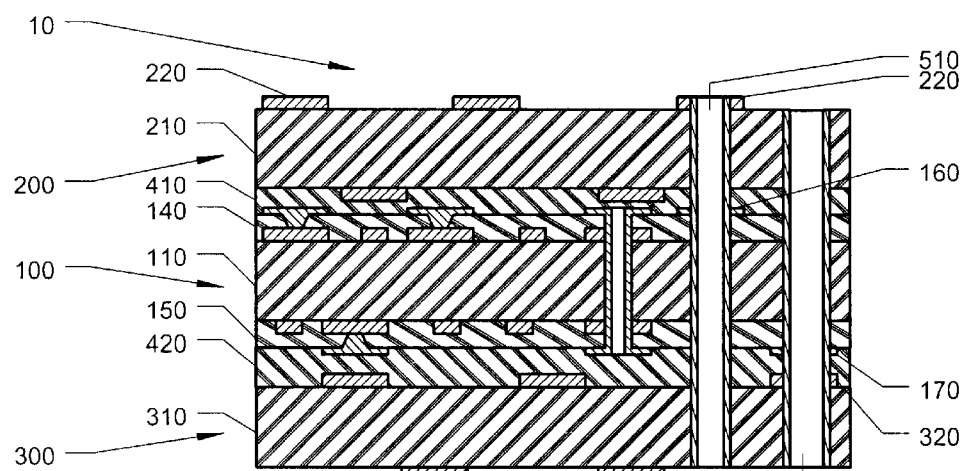
FIG. 2 is a non-exploded cutaway view of a wiring board assembly embodying the invention.

Referring to FIGS. 1 and 2, a printed wiring board assembly comprises a high density circuit routing component 100a, first standard layer 200, and a second standard layer 300. Routing component 100 is laminated between standard layers 200 and 300 within insulating and bonding layers 410 and 420 being used between routing component 100 and standard layers 200 and 300. Plated through holes 510 and 520 electrically couple routing component 100 to standard layers 200 and 300.

Routing component 100 comprises a core 110, a first conductive pattern 120, a second conductive pattern 130, a first dielectric layer 140, a second dielectric layer 150, a third conductive pattern 160, and a fourth conductive pattern 170. Core 110 preferably comprises 0.002 to 0.004 core thickness, glass reinforced PWB material. This core layer can also utilize one of many different resin systems and glass styles available on the market today including but not necessarily limited to FR4, BT, cyanate ester, and polyimide. The core 110 is processed using conventional processing methodologies in order to form a two-sided board having conductor layers 120 and 130 on each side of the core.

Once the conductor layers are formed on the core, a treatment is applied to the copper conductors of layers 120 and 130 that promotes high adhesive qualities for subsequent dielectric layers 140 and 150 that will be applied to the outer layers of the core.

Dielectric layers 140 and 150 are applied to opposite sides of core 110 so as to bond to and/or substantially encapsulate conductive patterns 120 and 130. These dielectric layers can be one of numerous readily available materials such as resin coated copper (RCC), dry film, or glass reinforced pre-preg with copper foil. Dielectric layers 140 and 150 are preferably dry film dielectric layers laminated to the outside conductive patterns/layers 120 and 130 and surfaces of the core 110.

After dielectric layers 140 and 150 are applied to core 110, vias 181, 182 are mechanically drilled, lased, or otherwise created in the dielectric layers, with such vias 181, 182 extending from the outside surface of the dielectric layers to the underlying conductors of conductive patterns 120 and 130 on the core 110 as well as through the entire laminate of core 100, patterns 120 and 130, and dielectric layers 140 and 150. The entire panel of the combined dielectric layers and core is then metalized using conventional processes (electroless copper or direct plate systems) which coats the surface of the outer layers 140 and 150 of dielectric as well as the blind and through hole via holes such as 181 and 182.

Conductive patterns 160 and 170 are then formed on top of the electroless copper deposit using conventional photo lithography methods consisting of application of dry film resist, exposure using a photo tool (artwork), electroplating, chemical stripping of the resist, and etching away of the excess (electroless) copper from the surface of the panel.

After formation of patterns 160 and 170, patterns 160 and 170 as well as the surfaces of dielectric layers 140 and 150 may be treated to promote adhesion with layers laminated to them such as 410 and 420. In regard to treatment of dielectric layers 140 and 150, treatment preferably comprises chemically roughening the surfaces.

It is contemplated that higher density circuitry can be formed through the previously described process because (a) the copper on the surface is extremely thin allowing the etching process to form extremely fine conductors, and (b) the surface of the dry film dielectric material is extremely flat allowing intimate contact of the photo resist and artwork photo tool to the surface of the panel.

Once the aforementioned processes are complete, the structure can be laminated into a conventional lay-up of a PWB.

Standard layer 200 comprises a core 210 and at least one conductive pattern 220. As with core 100, this core layer may utilize glass reinforced PWB material, or may utilize one of many different resin systems and glass styles available on the market today including but not necessarily limited to FR4, BT, cyanate ester, and polyimide. The core 200 is processed using conventional processing methodologies in order to form a board having at least one conductor layer/conductive pattern 220 on a surface of the core. Standard layer 200 will typically comprise two conductive patters on opposing sides and will typically have a lower density than routing component 100.

Standard layer 300 comprises a core 310 and at least one conductive pattern 320. As with cores 100 and 200, this core layer may utilize glass reinforced PWB material, or may utilize one of many different resin systems and glass styles available on the market today including but not necessarily limited to FR4, BT, cyanate ester, and polyimide. The core 300 is processed using conventional processing methodologies in order to form a board having at least one conductor layer/conductive pattern 320 on a surface of the core.

It is contemplated that having an ultra high density on routing component 100 allows for the overall reduction in layers in the PWB, and that the overall reduction in layers in the PWB results in a decrease in drilling problems related to thick, high layer count parts, easier electroplating of the through holes 510 and 520 of the final laminate, and increased yields.

The density of routing component 100 is ultra high in relation to standard layers 200 and 300. It is preferred that the density of routing layers 160 and 170 be in the range 10 microns to 40 microns, more preferably in the range 20 microns to 30 microns, and most preferably about 25 microns. It is contemplated that in many embodiments the density of routing component 100 will be at least 4 times greater than that of layers 200 and 300. Density, as used herein, refers to the width of lines and spaces.

It is also contemplated that laminating the high-density layers of routing component 100 within the overall package of the PWB allows for the utilization of the entire panel area to be used for high-density conductor routing rather than only portions of the area as would be the case if discreet "patches" were mounted to the surface of the PWB.

Thus, specific embodiments and applications of printed wiring board assemblies and assembly methods have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. A printed wiring board comprising an inner high density circuit routing component laminated within the wiring board, and at least one plated through hole electrically coupling the inner high density circuit routing component to a conductive pattern located on a surface of the printed wiring board, wherein the routing component is laminated within the wiring board by sandwiching the component between two dielectric layers of the wiring board, and applying heat and pressure to bond the routing component to the two dielectric layers; and wherein the high density circuit routing component comprises multiple layers, and the printed wiring board comprises at least one layer which is not part of the high density circuit routing component, and the density of at least one layer of the multiple layers of the routing component is at least 4 times greater than the density of the printed wiring board layer which is not part of the circuit routing component.

2. The printed wiring board of claim 1 wherein the high density circuit routing component has a conductive pattern on a surface, the surface conductive pattern having a density between 10 microns and 40 microns.

3. The printed wiring board of claim 1 wherein the high density circuit routing component has a conductive pattern on a surface, the surface conductive pattern having a density between 20 microns and 30 microns.

4. The printed wiring board of claim 1 wherein the high density circuit routing component has a conductive pattern on a surface, the surface conductive pattern having a density of approximately 25 microns.

5. A printed wiring board comprising an inner high density circuit routing component laminated within the wiring board, and at least one plated through hole electrically coupling the inner high density circuit routing component to a conductive pattern located on a surface of the printed wiring board;

wherein the high density circuit routing component comprises a glass reinforced core having conductive patterns on two sides of the core, dry film dielectric layers coupled to and encapsulating the conductive patterns, and conductive patterns on an exposed surface of each of the dry film dielectric layers, the conductive patterns on the exposed surface of each of the dry film dielectric layers being electrically coupled to the conductive patterns encapsulated by the dry film dielectric layers by conductive plated through holes passing through the dry film dielectric layers; and wherein at least one of the conductive pattern of the high density circuit routing component has a density at least 4 times greater than the density of the conductive pattern on the surface of the printed wiring board.

6. A printed wiring board comprising an inner high density circuit routing component laminated within the wiring board, and at least one plated through hole electrically coupling the inner high density circuit routing component to a conductive pattern located on a surface of the printed wiring board;

wherein the high density circuit routing component is laminated between two lower density wiring boards, and a first plated through hole electrically couples the routing component to a first of the two lower density wiring boards and a second plated through hole electrically couples the routing component to a second of the two lower density wiring boards, and the first and second plated through holes pass through both lower density wiring boards and the routing component; and wherein the routing component has a density at least 4 times greater than that of at least one of the lower density wiring boards.

7. The printed wiring board of claim 6 wherein the two lower density wiring boards each comprise a glass reinforced core.

8. A printed wiring board comprising an inner routing component laminated between two outer wiring boards wherein a first plated through hole electrically couples the routing component to a first of the two outer wiring boards and a second plated through hole electrically couples the routing component to a second of the two outer wiring boards, and the first and second plated through holes each pass through both outer wiring boards and the routing component, and the routing component has a density at least four times greater than the density of at least one of the outer wiring boards.

9. A printed wiring board comprising an inner high density circuit routing component laminated between two lower density wiring boards, wherein the two lower density wiring boards are coupled to each other only by blind or through-hole vias, the vias either connecting the boards directly to each other by bypassing the routing component, or indirectly to each other by coupling the lower density wiring boards to the routing component, and the routing component has a density at least four times greater than the density of at least one of the lower density wiring boards.

* * * * *